(12) United States Patent
Kim

(10) Patent No.: US 8,211,764 B2
(45) Date of Patent: Jul. 3, 2012

(54) SEMICONDUCTOR DEVICE OF COMMON SOURCE STRUCTURE AND MANUFACTURING METHOD OF SEMICONDUCTOR DEVICE OF COMMON SOURCE STRUCTURE

(75) Inventor: Nam Yoon Kim, Gyeonggi-do (KR)

(73) Assignee: Dongbu Hitek Co., Ltd., Seoul (KR)

( * ) Notice: Subject to any disclaimer, the term of this patent is extended or adjusted under 35 U.S.C. 154(b) by 303 days.

(21) Appl. No.: 12/623,734

(22) Filed: Nov. 23, 2009

(65) Prior Publication Data

US 2010/0155809 A1    Jun. 24, 2010

(30) Foreign Application Priority Data

Dec. 22, 2008    (KR) .......................... 10-2008-0131379

(51) Int. Cl.
  *H01L 21/336*    (2006.01)
(52) U.S. Cl. ........................................ 438/257; 257/316
(58) Field of Classification Search .................. 438/257; 257/316, E29.3, E21.422
  See application file for complete search history.

(56) References Cited

U.S. PATENT DOCUMENTS

| | | | |
|---|---|---|---|
| 7,465,629 B2 * | 12/2008 | Nam | 438/257 |
| 7,776,687 B2 * | 8/2010 | Kang et al. | 438/257 |
| 2009/0140313 A1 * | 6/2009 | Joo | 257/314 |
| 2009/0230457 A1 * | 9/2009 | Lee et al. | 257/324 |

* cited by examiner

*Primary Examiner* — Phuc Dang
(74) *Attorney, Agent, or Firm* — Saliwanchik, Lloyd & Eisenschenk

(57) ABSTRACT

A semiconductor device having a common source structure and method of manufacturing the same are provided. In one embodiment, the method includes: forming a plurality of gate lines on a semiconductor substrate, each constituted by a floating gate, a dielectric layer, and a control gate having a line form; forming a first dielectric layer on the semiconductor substrate including the gate line; forming a trench having the line form in the first dielectric layer, wherein the trench exposes the semiconductor substrate between the gate lines; and forming a common source in the trench. According to an embodiment, the common source is implemented as a poly line in the trench. Therefore, etching the substrate to provide a trench for a common source can be excluded. Accordingly, it is possible to inhibit the common source from being opened due to a remaining material in a trench, and reduce damage to the semiconductor substrate.

16 Claims, 4 Drawing Sheets

SEMICONDUCTOR DEVICE OF COMMON SOURCE STRUCTURE AND MANUFACTURING METHOD OF SEMICONDUCTOR DEVICE OF COMMON SOURCE STRUCTURE

CROSS-REFERENCE TO RELATED APPLICATION

This application claims the benefit under 35 U.S.C. §119 of Korean Patent Application No. 10-2008-0131379, filed Dec. 22, 2008, which is incorporated herein by reference in its entirety.

BACKGROUND

The present disclosure relates to a semiconductor device of a common source structure and a manufacturing method of a semiconductor device of the common source structure.

Since a recessed common source (RCS) process in a process of manufacturing a semiconductor device such as a flash memory has advantages of a simple structure, operational excellence, etc., the RCS process attracts large public attention. However, since the RCS process is complicated in process and short in process margin, the RCS process has a problem in that production yield is deteriorated.

FIG. 1 is a perspective view showing a form of a semiconductor device of a common source structure and FIGS. 2 to 4 are cross-sectional views showing a process of forming a common source taken along line A-A' of FIG. 1.

Referring to FIG. 1, a gate 10 serving as a word line is formed on a semiconductor substrate 40 and a common source 20 having a line form is formed along one side of the gate 10.

A drain (not shown) is formed at the other side of the gate 10 and a device separator 30 is formed vertical to the line of the gate 10.

The device separator 30 partitions a memory cell area. The common source 20 has a trench-type structure with the device separator 30.

Referring to FIG. 2, a second device separator 21 for forming the common source is formed on the semiconductor substrate 40 along a line of the gate 10. In an effort to lend greater clarity, the device separator 30 is not shown in FIGS. 2-4.

As shown in FIG. 3, the trench of the second device separator 21 is exposed by removing the oxide layer that forms the second device separator 21 by performing an etching process, and as shown in FIG. 4, after a photoresist pattern (not shown) is formed exposing one side of the line of the gate 10 and the trench T at the one side of the line of the gate 10, the common source 20 having the line form is completed by injecting ions into the exposed one side of the line of the gate 10.

At this time, as shown in FIG. 4, photoresist remnants may remain in the trench, blocking the ions from reaching into the substrate, thereby causing the common source 20 to be opened (i.e. fail to provide a continuous path for charge).

Further, during the etching of the oxide layer of the second device separator 21, the surface of the semiconductor substrate 40 is damaged, such that a profile of a drain area at the other side of the gate 10 is deteriorated to thereby influence the flow of current.

BRIEF SUMMARY

An object of embodiments of the present invention is to provide a semiconductor device of a common source structure and a manufacturing method of a semiconductor device of the common source structure which can inhibit a common source from being opened due to remaining materials in a trench and a semiconductor substrate from being damaged by excluding a trench structure while forming the common source.

A semiconductor device of a common source structure according to an embodiment includes: a gate line formed on a semiconductor substrate, the gate line constituted by a floating gate having a line form on the semiconductor substrate, a dielectric layer on the floating gate, and a control gate on the dielectric layer; a first dielectric layer formed on the semiconductor substrate including the gate line, the first dielectric layer including a trench having a line form, wherein the trench exposes the semiconductor substrate between the gate lines; and a common source formed in the trench.

A method of manufacturing a semiconductor device of a common source structure according to an embodiment includes: forming a plurality of gate lines each constituted by a floating gate, a dielectric layer, and a control gate having a line form on a semiconductor substrate; forming a first dielectric layer on the semiconductor substrate including the gate line and forming a trench having the line form in the first dielectric layer, wherein the trench exposes the semiconductor substrate between the gate lines; and forming a common source in the trench.

DETAILED DESCRIPTION

With reference to the accompanying drawings, a semiconductor device of a common source structure and a manufacturing method of a semiconductor device of the common source structure according to an embodiment will be described in detail.

Hereinafter, in describing embodiments, a detailed description of related known functions or components may make the purpose of the present invention obscure. Therefore, only core components relating directly to the technical spirit of the present invention will be described.

In the description of embodiments, it will be understood that when a layer (or film) is referred to as being 'on' another layer or substrate, it can be directly on another layer or substrate, or intervening layers may also be present. Further, it will be understood that when a layer is referred to as being 'under' another layer, it can be directly under another layer, or one or more intervening layers may also be present. In addition, it will also be understood that when a layer is referred to as being 'between' two layers, it can be the only layer between the two layers, or one or more intervening layers may also be present.

Figure 1:
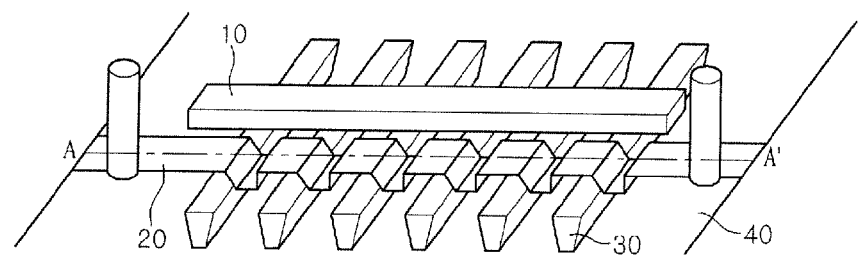
FIG. 1 is a perspective view showing a form of a semiconductor device of a common source structure.
Figure 2:
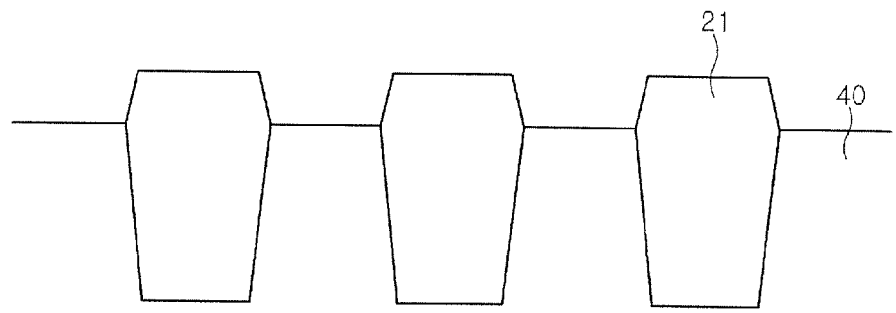
FIGS. 2 to 4 are cross-sectional views along A-A' of FIG. 1 illustrating a process of forming a common source.
Figure 3:
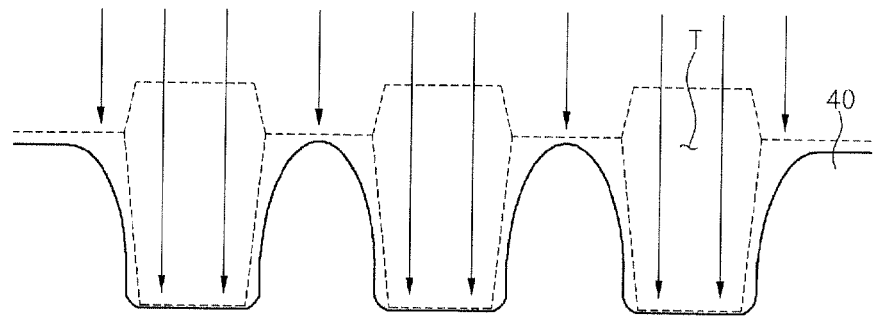
Figure 4:
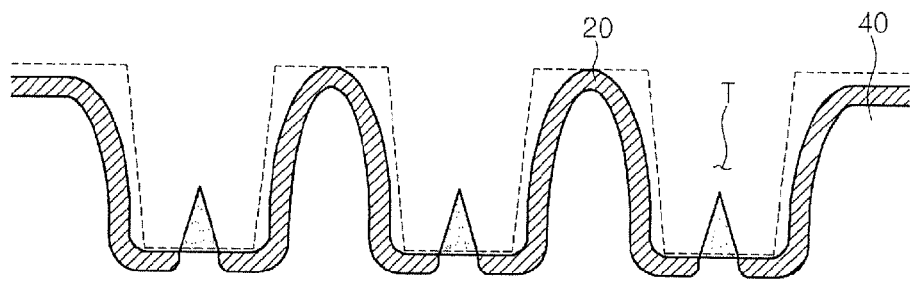
Figure 5:
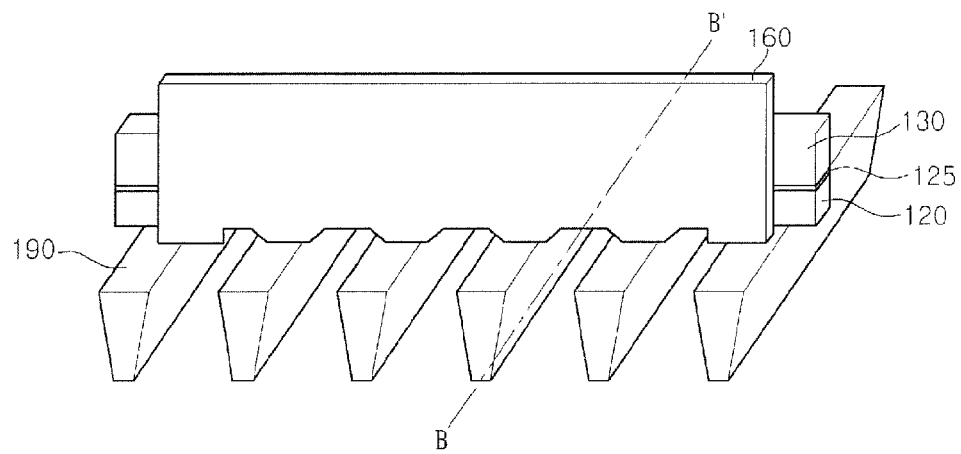
FIG. 5 is a perspective view showing a form of a semiconductor device of a common source structure according to an embodiment.

FIG. 5 is a perspective view showing a form of a semiconductor device of a common source structure according to an embodiment.

Referring to FIG. 5, a device separator 190 that separates an area of a semiconductor substrate 100 (see FIG. 6) by the unit of a memory cell can be formed on the semiconductor substrate.

Figure 6:
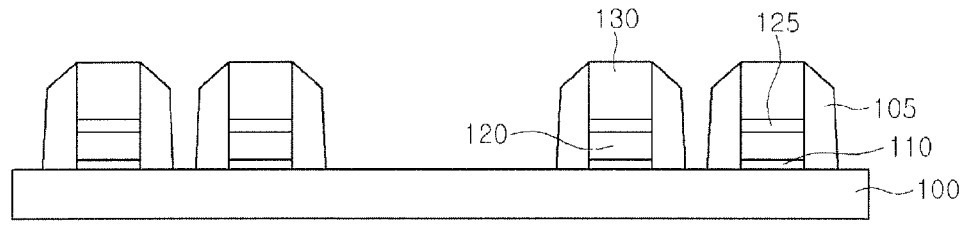
FIG. 6 is a cross-sectional view showing a form of a semiconductor device of a common source structure after a spacer is formed according to an embodiment.

A floating gate 120 is formed on a gate dielectric layer 110 (see FIG. 6). The floating gate 120 and the gate dielectric layer 110 have a line form and are formed vertical to the device separator 190. That is, the floating gate 120 is formed in a direction intersecting the line of the device separator 190.

A dielectric layer 125 is formed on the floating gate 120, and a control gate 130 is formed on the dielectric layer 125.

The dielectric layer 125 may be formed with an oxide-nitride-oxide (ONO) structure.

The floating gate 120, the dielectric layer 125, and the control gate 130 constitute a gate line.

Although not shown in FIG. 5, spacers 105 (see FIG. 6) are formed on both side walls of the gate line of the floating gate 120, the dielectric layer 125, and the control gate 130.

Further, a common source 160 having a wall (line) shape is formed adjacent to the spacer 105 positioned at one side wall of the gate line.

In case where the semiconductor device is a flash memory device, two gate lines, each constituted by a floating gate 120, a dielectric layer 125, and a control gate 130, are paired to form a unit cell and the common source 160 is interposed between the two gate lines.

FIGS. 6 to 13 show a case where two gate lines, each constituted by a floating gate 120, a dielectric layer 125, and a control gate 130, are paired and show cross-sectional views of a semiconductor device taken along line B-B' of FIG. 5 to illustrate a manufacturing method.

Figure 7:
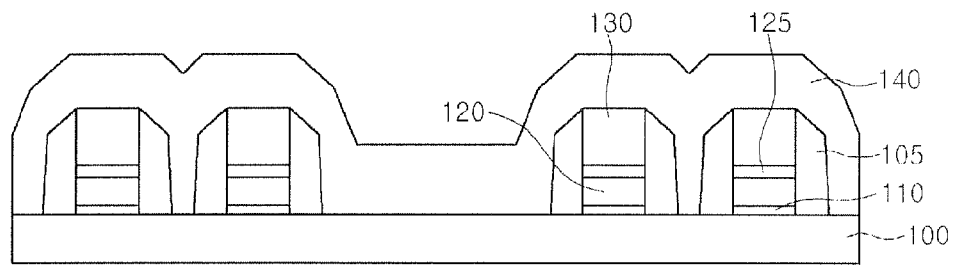
FIG. 7 is a cross-sectional view showing a form of a semiconductor device of a common source structure after a first dielectric layer is formed according to an embodiment.

FIG. 6 is a cross-sectional view showing a form of a semiconductor device of a common source structure after a spacer 105 is formed according to an embodiment and FIG. 7 is a cross-sectional view showing a form of a semiconductor device of a common source structure after a first dielectric layer 140 is formed according to an embodiment.

Referring to FIGS. 6 and 7, after forming a spacer 105 on the sidewalls of the gate lines (constituted by elements 120, 125, and 130), the first dielectric layer 140 is formed on the semiconductor substrate 100 including the spacer 105 and the control gate 130 without forming a trench in the semiconductor substrate 100 between the adjacent gate lines as in the related art.

In an embodiment, the first dielectric layer 140 may be made of a material such as tetraethyl orthosilicate (TEOS) (which may be formed using $Si(C_2H_5O_4)$).

Figure 8:
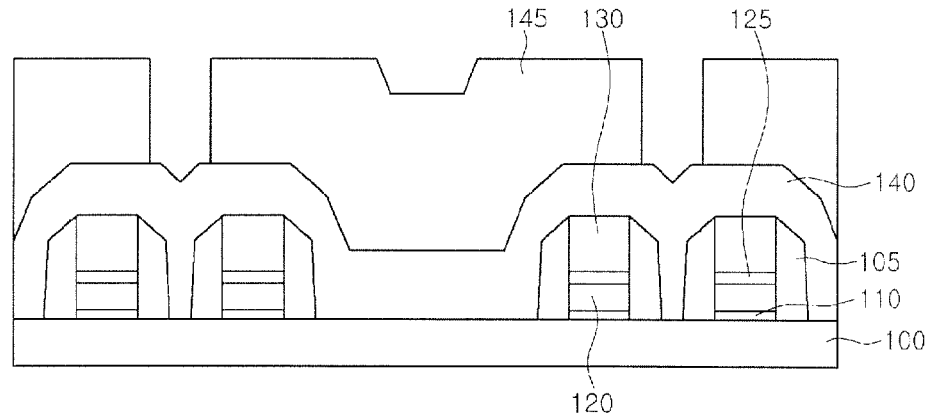
FIG. 8 is a cross-sectional view showing a form of a semiconductor device of a common source structure after a photoresist pattern is formed according to an embodiment.

Referring to FIG. 8, a photoresist material is applied onto the first dielectric layer 140, and a photoresist pattern 145 opening a portion between the adjacent gate lines (each constituted by elements 120, 125, and 130) is formed through reticle alignment, development, and exposure processes.

Figure 9:
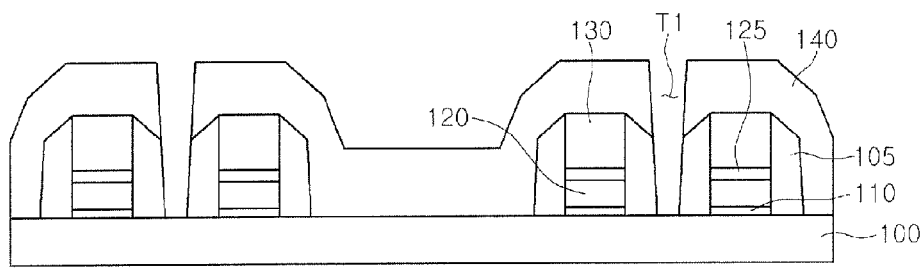
FIG. 9 is a cross-sectional view showing a form of a semiconductor device of a common source structure after a trench is formed in a first dielectric layer according to an embodiment.

Referring to FIG. 9, the first dielectric layer 140 is etched using the photoresist pattern 145 as an etching mask to form a trench T1 in the first dielectric layer 140. The trench T1 is formed exposing the semiconductor substrate 100 between the spacers 105 of the adjacent gate lines.

Thereafter, the photoresist pattern 145 is removed.

Figure 10:
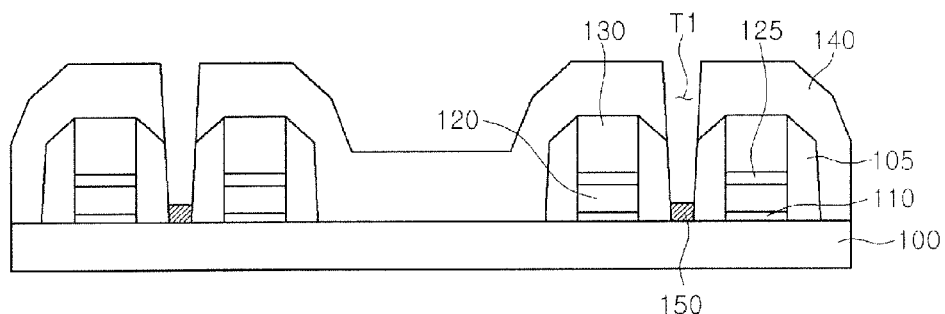
FIG. 10 is a cross-sectional view showing a form of a semiconductor device of a common source structure after a salicide layer is formed according to an embodiment.

Subsequently, referring to FIG. 10, a salicide layer 150 can be formed on the semiconductor substrate 100 exposed through the bottom of the trench T1.

The salicide layer 150 serves as an ohmic resistor between the semiconductor substrate 100 and a common source 160 to be formed above the salicide layer.

Figure 11:
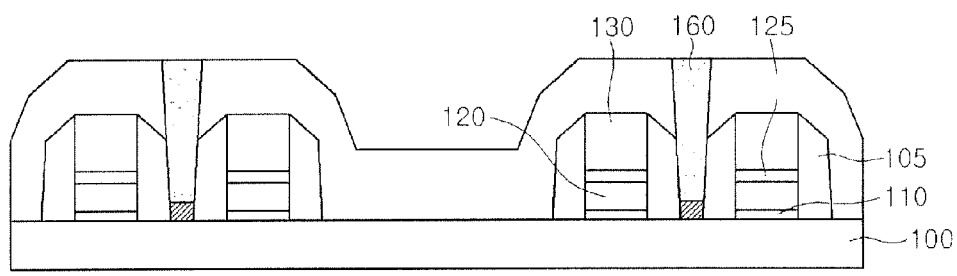
FIG. 11 is a cross-sectional view showing a form of a semiconductor device of a common source structure after a common source is formed according to an embodiment.

FIG. 11 is a cross-sectional view showing a form of a semiconductor device of a common source structure after a common source 160 is formed according to an embodiment.

For example, after forming the salicide layer 150, a polysilicon layer is formed on the first dielectric layer 140 so as to bury the trench T1. Then, the polysilicon layer is planarized so as to expose the surface of the first dielectric layer 140.

Therefore, the common source 160 made of a polysilicon material is formed in the trench T1.

Figure 12:
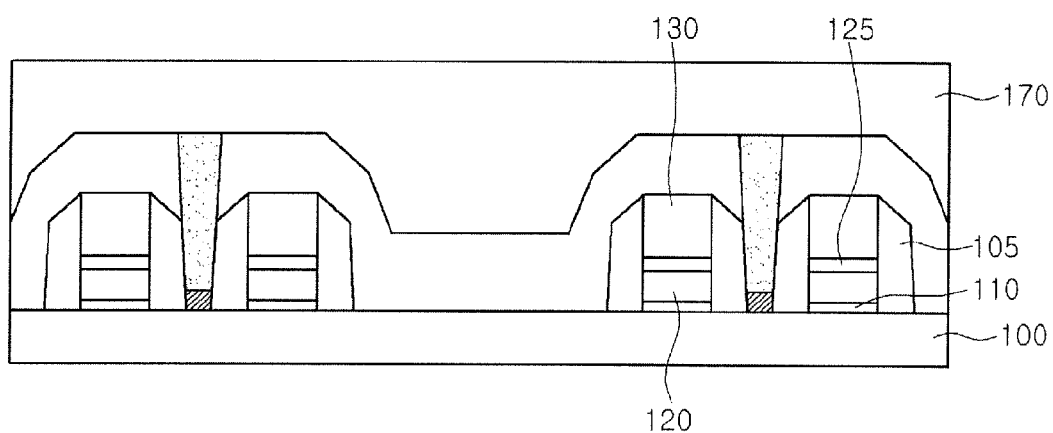
FIG. 12 is a cross-sectional view showing a form of a semiconductor device of a common source structure after a second dielectric layer is formed according to an embodiment.

Referring to FIG. 12, a second dielectric layer 170 is formed on the substrate 100.

According to an embodiment, after forming the common source 160, the second dielectric layer 170 is formed on the first dielectric layer 140.

The second dielectric layer 170 serves to isolate the common source 160 from an upper structure and may be made of a material such as TEOS.

Figure 13:
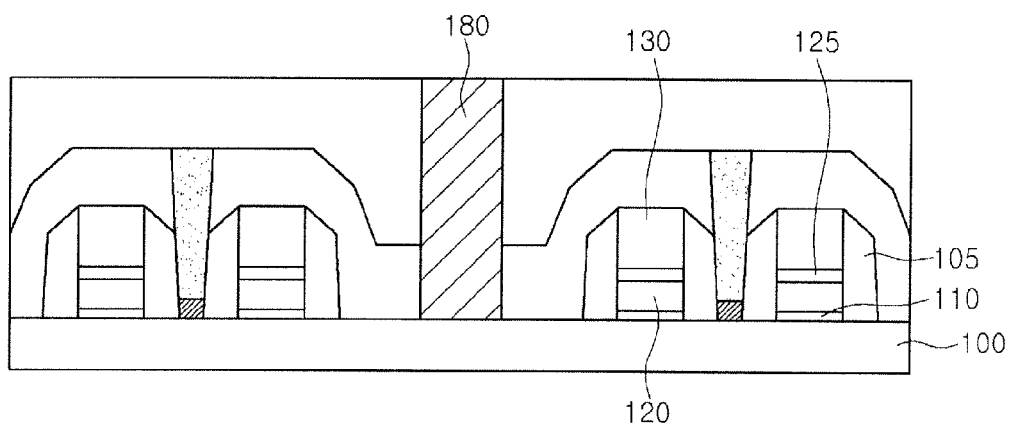
FIG. 13 is a cross-sectional view showing a form of a semiconductor device of a common source structure after a contact plug is formed according to an embodiment.

Referring to FIG. 13, a contact plug 180 for grounding the device separator 190 can be formed in the second dielectric layer 170. Consequently, the semiconductor device of the common source structure according to an embodiment may be completed.

In the semiconductor device of the common source structure according to an embodiment, the common source 160 is self-aligned and a source bias can be applied without a source contact for each memory cell. Further, since the source contact does not need to be provided in plural, the integration of the memory cell can be improved.

In accordance with embodiments of the present invention, the following effects can be achieved.

First, by implementing a common source having a poly line form, a trench structure can be excluded at the time of forming the common source. Accordingly, it is possible to inhibit the common source from being opened due to a remaining material in a trench, causing an open circuit, and to reduce damage to the semiconductor substrate (active area).

Second, by using the common source having the poly line form, it is possible to increase operation speed at the time of deleting a memory, secure the reliability of the semiconductor device, and improve production yield.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A method of manufacturing a semiconductor device of a common source structure, comprising:
    forming a plurality of gate lines on a semiconductor substrate, each gate line comprising a floating gate, a dielectric layer, and a control gate having a line form;
    forming a first insulating dielectric layer on the semiconductor substrate including the gate line;
    forming a trench having the line form in the first insulating dielectric layer, wherein the trench exposes a portion of the semiconductor substrate between a pair of the gate lines;
    forming a salicide layer on the semiconductor substrate exposed through the trench; and
    forming a common source in the trench on the salicide layer.

2. The method of manufacturing a semiconductor device of the common source structure according to claim 1, further comprising:
    forming a device separator in the semiconductor substrate to define unit memory cell areas.

3. The method of manufacturing a semiconductor device of the common source structure according to claim 2, further comprising:
    forming a contact plug through the first insulating dielectric layer for grounding the device separator after forming the common source.

4. The method of manufacturing a semiconductor device of the common source structure according to claim 1, further comprising:
    forming a gate dielectric layer having the line form on the semiconductor substrate before the floating gate is formed.

5. The method of manufacturing a semiconductor device of the common source structure according to claim 1, wherein two gate lines of the plurality of gate lines are paired with the common source interposed therebetween to form a unit cell.

6. The method of manufacturing a semiconductor device of the common source structure according to claim 1, wherein the forming a common source comprises:
    forming a polysilicon layer on the first insulating dielectric layer so as to bury the trench; and
    planarizing the polysilicon layer so as to expose the surface of the first insulating dielectric layer.

7. The method of manufacturing a semiconductor device of the common source structure according to claim 1, further comprising:
    forming a second insulating dielectric layer on the first insulating dielectric layer after forming the common source.

8. The method of manufacturing a semiconductor device of the common source structure according to claim 7, wherein one or more layers of the first insulating dielectric layer and the second insulating dielectric layer are made of TEOS.

9. A semiconductor device of a common source structure, comprising:
    a pair of gate lines, each gate line comprising a floating gate having a line form formed on a semiconductor substrate, a dielectric layer formed on the floating gate, and a control gate formed on the dielectric layer;
    a first insulating dielectric layer formed on the semiconductor substrate including the gate line, wherein the first insulating dielectric layer comprises a trench having the line form formed therein, wherein the trench exposes the semiconductor substrate between the gate lines;
    a salicide layer formed on the semiconductor substrate exposed through the trench; and
    a common source formed in the trench on the salicide layer.

10. The semiconductor device of the common source structure according to claim 9, further comprising:
    a device separator in the semiconductor substrate to define a memory cell unit area, wherein the device separator is formed in a direction intersecting the line form of the gate lines.

11. The semiconductor device of the common source structure according to claim 9, further comprising:
    a gate dielectric layer formed between the semiconductor substrate and each of the floating gates.

12. The semiconductor device of the common source structure according to claim 9, wherein the pair of gate lines and the common source interposed therebetween form a unit cell.

13. The semiconductor device of the common source structure according to claim 9, wherein the common source is made of a polysilicon material.

14. The semiconductor device of the common source structure according to claim 9, further comprising:
    a second insulating dielectric layer formed on the first insulating dielectric layer.

15. The semiconductor device of the common source structure according to claim 14, further comprising:
    a device separator in the semiconductor substrate to define a memory cell unit area, wherein the device separator is formed in a direction intersecting the line form of the gate lines;
    a contact plug formed through the second insulating dielectric layer and the first insulating dielectric layer to ground the device separator.

16. The semiconductor device of the common source structure according to claim 14, wherein one or more layers of the first insulating dielectric layer and the second insulating dielectric layer are made of TEOS.

* * * * *